US012586767B2

(12) United States Patent
Choudhury et al.

(10) Patent No.: US 12,586,767 B2
(45) Date of Patent: Mar. 24, 2026

(54) MULTI-PORT CROSS FLOW SYSTEM

(71) Applicant: Applied Materials, Inc., Santa Clara, CA (US)

(72) Inventors: Rupankar Choudhury, Agartala (IN); Sanjay G. Kamath, Fremont, CA (US); Juan Carlos Rocha-Alvarez, San Carlos, CA (US); Sridhar Bachu, Hyderabad (IN); Mukesh Singh Dhami, Lucknow (IN); Dan-il Yoon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 244 days.

(21) Appl. No.: 18/359,772

(22) Filed: Jul. 26, 2023

(65) Prior Publication Data

US 2025/0037980 A1     Jan. 30, 2025

(51) Int. Cl.
| | |
|---|---|
| *H01J 37/32* | (2006.01) |
| *C23C 16/44* | (2006.01) |
| *C23C 16/455* | (2006.01) |

(52) U.S. Cl.
CPC .... *H01J 37/32862* (2013.01); *C23C 16/4412* (2013.01); *C23C 16/4558* (2013.01); *H01J 37/32834* (2013.01); *H01J 2237/3321* (2013.01)

(58) Field of Classification Search
CPC .......... H01J 37/32862; H01J 37/32834; H01J 2237/3321; C23C 16/4412; C23C 16/4558
See application file for complete search history.

(56) References Cited

U.S. PATENT DOCUMENTS 5,443,647 A * 8/1995 Aucoin ................... C30B 25/12
                                                    118/723 ME
5,587,014 A * 12/1996 Iyechika ............... C30B 29/403
                                                    117/106
(Continued)

FOREIGN PATENT DOCUMENTS

TW        200903693 A      1/2009
TW        202211990 A      4/2022
(Continued)

OTHER PUBLICATIONS

Application No. PCT/US2024/038508 , International Search Report and Written Opinion, Mailed On Oct. 28, 2024, 9 pages.
(Continued)

*Primary Examiner* — Patrick C Williams
(74) *Attorney, Agent, or Firm* — Kilpatrick Townsend & Stockton LLP

(57)        ABSTRACT

A processing chamber and port adaptor are provided. Processing chambers include a chamber body having a lid coupled to the first end of the chamber body, a gas ring adjacent the first end of the chamber body, and a substrate support, where a processing region is defined between the substrate support and the lid. The processing chamber includes a port adapter coupled to the second end of the chamber body. The port adapter includes a body defining a plurality of apertures in fluid communication with the processing region, where each of the apertures are spaced apart along the body such that a distance between adjacent apertures is within about 20% of an average aperture spacing distance, an individually controllable valve fluidly coupled to one or more of the plurality of apertures, and an exhaust system in fluid communication with a system foreline and the plurality of apertures.

11 Claims, 10 Drawing Sheets

(56)                     References Cited

U.S. PATENT DOCUMENTS

| | | | | |
|---|---|---|---|---|
| 5,630,881 | A * | 5/1997 | Ogure | H01L 21/68792 |
| | | | | 118/733 |
| 5,980,638 | A * | 11/1999 | Janos | H01J 37/32834 |
| | | | | 118/715 |
| 7,964,040 | B2 * | 6/2011 | Rasheed | H01J 37/32834 |
| | | | | 134/1 |
| 2002/0185067 | A1 * | 12/2002 | Upham | B08B 7/0035 |
| | | | | 134/1.1 |
| 2006/0291133 | A1 | 12/2006 | Hackenberg | |
| 2010/0022093 | A1 | 1/2010 | Yamaguchi | |
| 2022/0154338 | A1 | 5/2022 | Olsen et al. | |
| 2023/0160066 | A1 | 5/2023 | Abe et al. | |

FOREIGN PATENT DOCUMENTS

| | | | |
|---|---|---|---|
| TW | 202235674 | A | 9/2022 |
| TW | 202326907 | A | 7/2023 |
| WO | 2023081143 | A2 | 5/2023 |

OTHER PUBLICATIONS

Taiwanese Application No. 113127729, Notice of Decision to Grant mailed on Jun. 11, 2025, 6 pages (3 pages of English Translation and 3 pages of Original Copy).

* cited by examiner

400

MULTI-PORT CROSS FLOW SYSTEM

TECHNICAL FIELD

The present technology relates to components and apparatuses for semiconductor manufacturing. More specifically, the present technology relates to processing chamber components and other semiconductor processing equipment.

BACKGROUND OF THE INVENTION

Integrated circuits are made possible by processes which produce intricately patterned material layers on substrate surfaces. Producing patterned material on a substrate requires controlled methods for deposition, expansion, and removal of materials. However, with new processing designs, producing high quality layers of material may be challenging. For instance, after a deposition process, undesirable contaminants may remain within the chamber body, such as unwanted deposition on an interior of the chamber. Such contaminants may be cleaned through a cleaning gas (e.g., also referred to as an etchant gas, which may be a fluorine containing gas, such as nitrogen trifluoride) released into the chamber body, between subsequent deposition operations. The cleaning gas may react with the contaminants and be subsequently exhausted out of the chamber body through an exhaust system. However, inefficient removal of the cleaning gas out of the chamber body may lead to asymmetric cleaning, leaving certain parts of the chamber body contaminated even after a cleaning operation is complete.

Thus, there is a need for improved systems and methods that can be used to produce high quality devices and structures. These and other needs are addressed by the present technology.

BRIEF SUMMARY OF THE INVENTION

The present technology is generally directed to processing chambers, port adapters, and methods of processing a substrate. In embodiments, processing chambers include a chamber body having a first end and a second end, a lid coupled to the first end of the chamber body, a gas ring adjacent to the first end of the chamber body, a substrate support, and a port adapter system. Processing chambers include a processing region defined between the substrate support and the lid. The port adapter is coupled to the second end of the chamber body, and includes a port adapter body defining a plurality of apertures in fluid communication with the processing region, an individually controllable valve fluidly coupled to one or more of the plurality of apertures, and an exhaust system in fluid communication with a system foreline and the plurality of apertures. The plurality of apertures in the port adapter body are spaced apart along the port adapter body such that a distance between adjacent apertures is within about 30% of an average aperture spacing distance.

In embodiments, processing chambers include where each aperture of the plurality of apertures is spaced apart along an arcuate path such that the distance between respective apertures is from about 100° to about 140°. In more embodiments, processing chambers include where each aperture of the plurality of apertures is spaced apart along an arcuate path such that the distance between respective apertures is from about 115° to about 125°. Furthermore, in embodiments, the port adapter system is permanently or releasably affixed to the second end of the chamber body or is monolithically formed with the chamber body. Additionally or alternatively, in embodiments, each aperture of the plurality of apertures is fluidly coupled to the exhaust system along a corresponding flow path, where each of the flow paths have a corresponding flow path length, where a first aperture of the plurality of apertures has a first flow path to the exhaust system with a corresponding first flow path length that is different than a flow path length of one or more other apertures of the plurality of apertures. In yet more embodiments, the first flow path length is longer than the flow path length of the one or more other apertures of the plurality of apertures, and the first aperture defines a larger diameter than a corresponding diameter of the other apertures of the plurality of apertures. In embodiments, the first flow path length is shorter than the flow path length of the one or more other apertures of the plurality of apertures, and the diameter of the first aperture is smaller than the corresponding diameter of the other apertures of the plurality of apertures. In embodiments, the processing chamber also includes a pipe system include one or more non-linear portions.

The present technology is also generally directed to a port adapter that includes an adapter body, an individually controllable valve, and a plurality of pipe systems. The adapter body defines an interior surface, an outer surface, and a plurality of apertures extending from the interior surface to the outer surface, and a distance between adjacent apertures that is within about 30% of an average aperture spacing distance. The individually controllable valve is fluidly coupled to one or more of the plurality of apertures. A first pipe system of the plurality of pipe systems includes a diameter and a total path length, where the diameter, the total path length, or both the diameter and the total path length, is different than a second diameter, a second total path length, or both the second diameter and the second total path length of a second pipe system of the plurality of pipe systems.

In embodiments, each aperture of the plurality of apertures is spaced apart along an arcuate path such that a distance between respective apertures is from about 100° to about 140°. In further embodiments, each aperture of the plurality of apertures is spaced apart along an arcuate path such that a distance between respective apertures is from about 115° to about 125°. In more embodiments, each aperture of the plurality of apertures is fluidly coupled to a pipe system of the plurality of pipe systems, wherein each pipe system of the plurality of pipe systems includes a flow path length between the respective aperture and a respective pipe system terminus, where a first aperture of the plurality of apertures is fluidly coupled to the first pipe system, and the first pipe system has a first flow path length that is different than a flow path length of one or more other apertures of the plurality of apertures. Furthermore, in embodiments, the first aperture defines a diameter that is different than a diameter of the other apertures of the plurality of apertures. In yet more embodiments, the first flow path length is longer than the flow path length of the one or more other apertures of the plurality of apertures, and the first aperture defines a larger diameter than a corresponding diameter of the other apertures of the plurality of apertures. In embodiments, the first flow path length is shorter than the flow path length of the one or more other apertures of the plurality of apertures, and the diameter of the first aperture is smaller than the corresponding diameter of the other apertures of the plurality of apertures.

The present technology is also generally directed to methods of processing a substrate. Methods include introducing a gas into a first end of the chamber body of a processing chamber, evacuating the gas through a port adapter system coupled to a second end of the chamber body, closing a first valve of the plurality of valves while maintaining at least a second valve of a plurality of valves in an open configuration, and further removing the gas from the chamber body through the port adapter system. Methods include where the port adapter system has a port adapter body and a plurality of independently controllable valves fluidly coupled to the plurality of apertures. The plurality of apertures are in fluid communication with the processing chamber, and are spaced apart from each other along the port adapter.

In embodiments, methods include detecting a remaining reside and/or an asymmetric flow path prior to closing the first valve. Furthermore, in embodiments, methods include where the port adapter system also includes a plurality of pipe systems, each pipe system of the plurality of pipe systems fluidly connected to an aperture of the plurality of apertures, and further includes correcting one or more of a pipe system path length and a pipe system diameter based upon the detection of an asymmetric flow path. In embodiments, methods include re-opening the first valve after removing the residue.

BRIEF DESCRIPTION OF THE DRAWINGS

A further understanding of the nature and advantages of the disclosed technology may be realized by reference to the remaining portions of the specification and the drawings.

Figure 1:
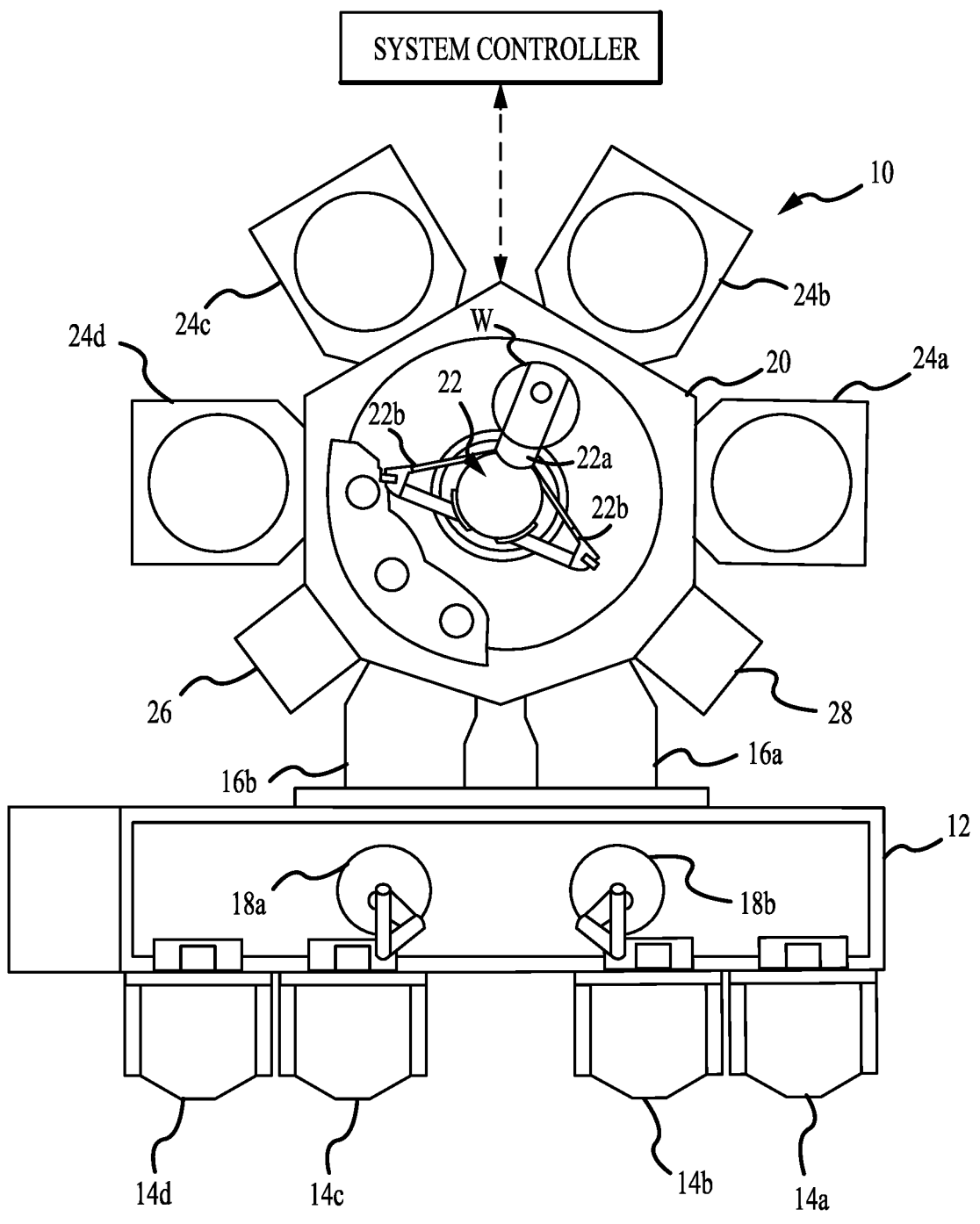
FIG. 1 shows a top-down schematic view of a processing system according to embodiments of the present technology.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

One of the primary steps in the fabrication of modern semiconductor devices is the formation of one or more layers, such as one or more silicon oxide layers, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film. Unwanted deposition on areas such as the walls of the processing chamber also occurs during such CVD processes.

Thus, after a deposition process has been completed, cleaning the undesirable contaminants remaining from the previous deposition operation is important for subsequent substrate processing steps to be completed without contamination, defects, and processing inefficiencies. Namely, if such contaminants are not removed from the chamber, the surface characteristics and radio frequency (RF) coupling efficiency of certain components of the processing system may be altered such that there are performance reductions and loss of production yield. Further, such contaminants may flake off and land on the substrate surface, which may lead to device defects.

To conduct a cleaning process, a cleaning gas, such as nitrogen trifluoride, may be flowed into a processing chamber from the top end of the chamber body to react with the contaminants in the processing region of the chamber body. Thus, an exhaust system, disposed below the pedestal, may be used to remove the cleaning gas and create a flow path from the top end of the chamber body, around a pedestal and/or any other chamber components, to the exhaust system. If the cleaning gas is not distributed around the chamber body in a uniform manner, the cleaning gas may not interact with all portions of the chamber interior evenly, potentially leaving undesirable contaminants in the interior portion of the chamber body or on components therein, such as the pedestal. For instance, conventional systems utilize asymmetric exhaust ports in order to quickly remove high volumes of cleaning gasses. However, such exhaust port systems often fail to properly clean portions of the chamber sidewalls, pedestal, and/or lid that are located on opposite sides of the chamber, or spaced apart from, from the one or more exhaust ports.

The present disclosure provides for a port adapter system that overcomes these and other problems, namely, a port adapter system that aids in improving the cleaning uniformity of a cleaning gas across all or a portion of a processing region of a processing chamber. Specifically, the present technology has surprisingly found that a carefully tailored combination of port apertures, port connection length, and/or independently controllable valves allows the flow rate and flow path of a cleaning gas through the chamber and into the port apertures to be controlled to more uniformly distribute a cleaning gas across the entire processing region of the chamber body. Moreover, due to the independently controllable features of the present technology, the ports may be adapted in situ to clean portions of the chamber if asymmetries are detected. In some embodiments, valves may be used to control this tailored cleaning flow rate and flow path. In other embodiments, the size, shape, or a combination thereof, of the apertures and the piping system may additionally or alternatively be adjusted to improve the uniformity of gas removal. The port adapter according to the present technology can, therefore, more uniformly clean the chamber body, and, in embodiments, in a more efficient manner. Moreover, surprisingly, in embodiments, the systems and processes discussed herein may remove substantially all or all undesirable contaminants from the chamber body.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2A:
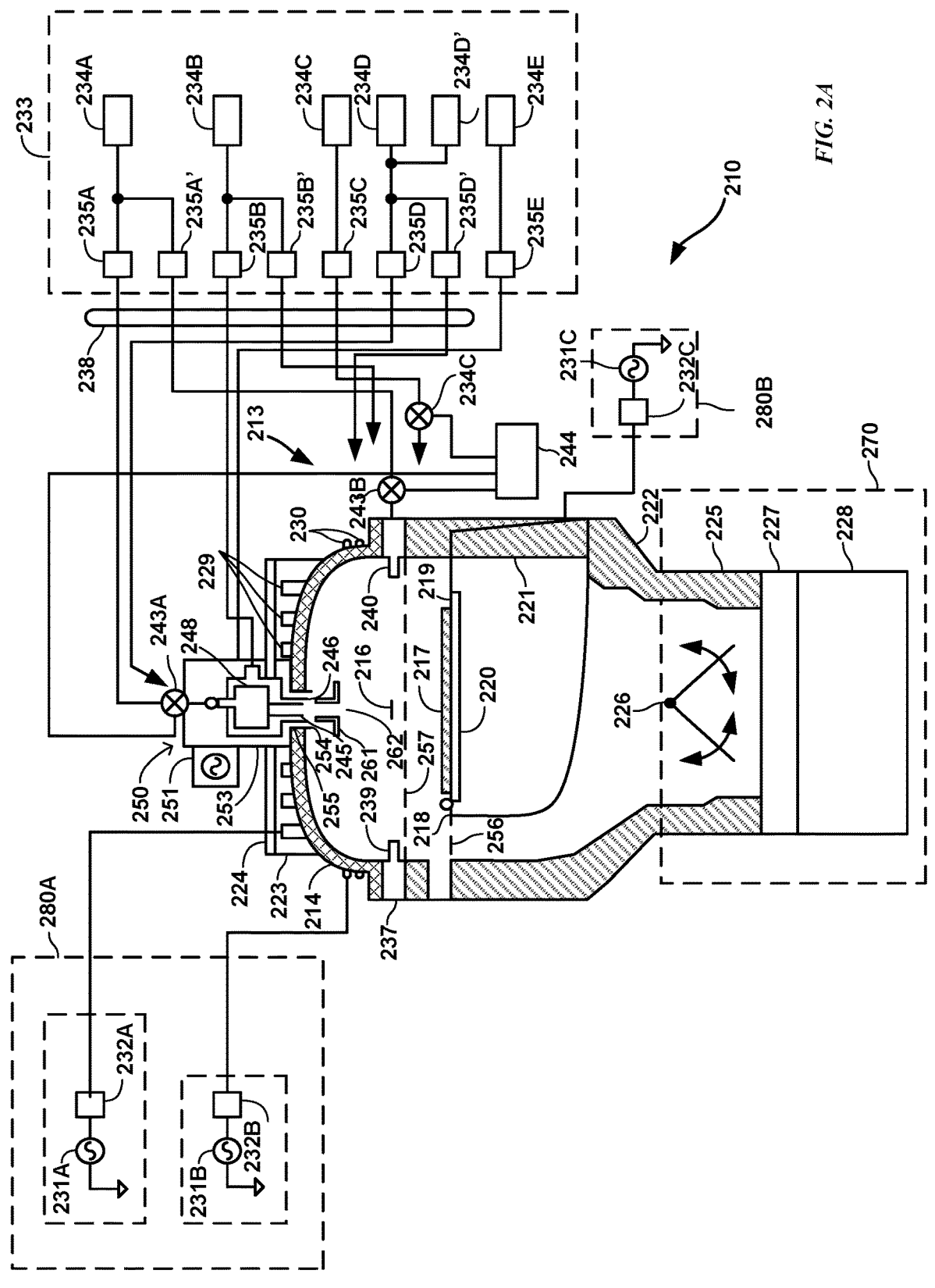
FIG. 2A illustrates a high-density plasma chemical vapor deposition (HDP-CVD) system according to one or more embodiments.

FIG. 2A schematically illustrates the structure of such an HDP-CVD system 210 in an embodiment. The system 210 includes a chamber 213, a vacuum system 270, a source plasma system 280A, a substrate bias plasma system 280B, a gas delivery system 233, and a remote plasma cleaning system 250.

The upper portion or lid of chamber 213 includes a dome 214, which is made of a ceramic dielectric material, such as aluminum oxide or aluminum nitride. Dome 214 defines an upper boundary of a plasma processing region 216. Plasma processing region 216 is bounded on the bottom by the upper surface of a substrate 217 and a substrate support member 218.

A heater plate 223 and a cold plate 224 surmount, and are thermally coupled to, dome 214. Heater plate 223 and cold plate 224 allow control of the dome temperature to within about +10° C. over a range of about 100° C. to 650° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 213 includes a body member 222, which joins the chamber to the vacuum system. A base portion 221 of substrate support member 218 is mounted on, and forms a continuous inner surface with, body member 222. Substrates are transferred into and out of chamber 213 by a robot blade (not shown) through an insertion/removal opening (not shown) in the side of chamber 313. Lift pins (not shown) are raised and then lowered under the control of a motor (also not shown) to move the substrate from the robot blade at an upper loading position 257 to a lower processing position 256 in which the substrate is placed on a substrate receiving portion 219 of substrate support member 218. Substrate receiving portion 219 includes an electrostatic chuck 220 that secures the substrate to substrate support member 218 during substrate processing. In a preferred embodiment, substrate support member 218 is made from an aluminum oxide or aluminum ceramic material.

Vacuum system 270 includes throttle body 225, which houses twin-blade throttle valve 226 and is attached to gate valve 227 and turbo-molecular pump 228. It should be noted that throttle body 225 offers minimum obstruction to gas flow, and allows symmetric pumping. Gate valve 227 can isolate pump 228 from throttle body 225, and can also control chamber pressure by restricting the exhaust flow capacity when throttle valve 226 is fully open. The arrangement of the throttle valve, gate valve, and turbo-molecular pump allow accurate and stable control of chamber pressures up to about 1 mTorr to about 2 Torr.

The source plasma system 280A includes a top coil 229 and side coil 230, mounted on dome 214. A symmetrical ground shield (not shown) reduces electrical coupling between the coils. Top coil 229 is powered by top source RF (SRF) generator 231A, whereas side coil 230 is powered by side SRF generator 231B, allowing independent power levels and frequencies of operation for each coil. This dual coil system allows control of the radial ion density in chamber 213, thereby improving plasma uniformity. Side coil 230 and top coil 229 are typically inductively driven, which does not require a complimentary electrode. In a specific embodiment, the top source RF generator 231A provides up to 10,000 watts of RF power at nominally 2 MHz and the side source RF generator 231B provides up to 10,500 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A substrate bias plasma system 280B includes a bias RF ("BRF") generator 231C and a bias matching network 232C. The bias plasma system 280B capacitively couples substrate portion 217 to body member 222, which act as complimentary electrodes. The bias plasma system 280B serves to enhance the transport of plasma species (e.g., ions) created by the source plasma system 280A to the surface of the substrate. In a specific embodiment, the substrate bias RF generator provides up to 10,000 watts of RF power at a frequency of about 13.56 MHz.

RF generators 231A and 231B include digitally controlled synthesizers. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 232A and 232B match the output impedance of generators 231A and 231B with their respective coils 229 and 230. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 2B:
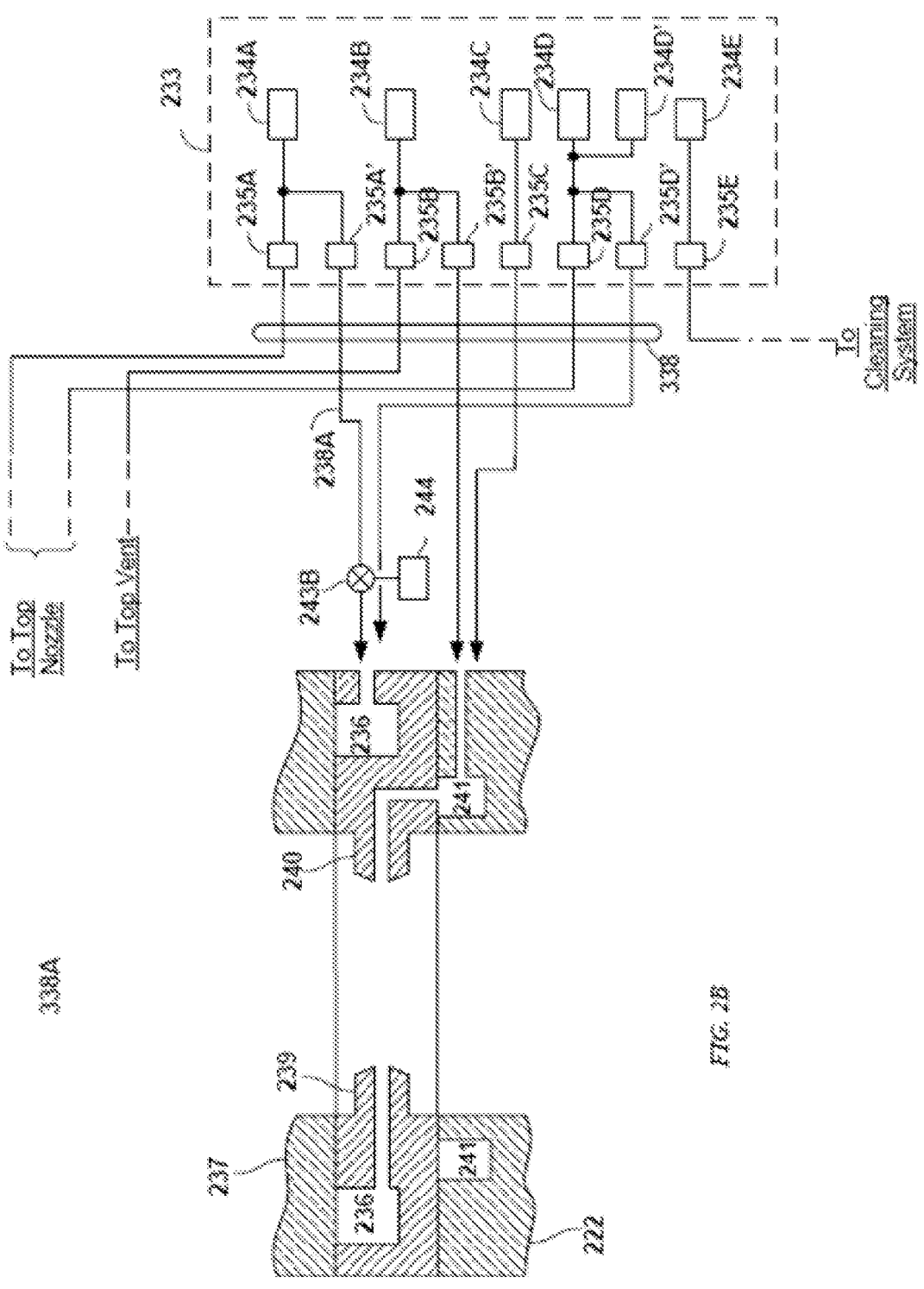
FIG. 2B illustrates a cross-sectional view of a gas ring that may be used in the high-density plasma chemical vapor deposition (HDP-CVD) of FIG. 2B.

A gas delivery system 233 provides gases from several sources, 234A-234E to a chamber for processing the substrate by way of gas delivery lines 238 (only some of which are shown). As would be understood by a person of skill in the art, the actual sources used for sources 234A-234E and the actual connection of delivery lines 238 to chamber 213 varies depending on the deposition and cleaning processes executed within chamber 213. Gases are introduced into chamber 213 through a gas ring 237 and/or a top nozzle 245. FIG. 2B is a simplified, partial cross-sectional view of chamber 213 showing additional details of gas ring 237.

In one embodiment, first and second gas sources, 234A and 234B, and first and second gas flow controllers, 235A' and 235B', provide gas to ring plenum 236 in gas ring 237 by way of gas delivery lines 238 (only some of which are shown). Gas ring 237 has a plurality of source gas nozzles 239 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In an embodiment, gas ring 237 has 12 source gas nozzles made from an aluminum oxide ceramic, such as 10 source gas nozzles, such as 8 source gas nozzles, such as 6 source gas nozzles, such as 4 source gas nozzles, or such as 14 source gas nozzles, such as 16 source gas nozzles, such as 18 source gas nozzles, such as 20 source gas nozzles, or any ranges or values therebetween.

Gas ring 237 also has a plurality of oxidizer gas nozzles 240 (only one of which is shown), which in one embodiment are co-planar with and shorter than source gas nozzles 239, and in one embodiment receive gas from body plenum 241. In some embodiments it is desirable not to mix source gases and oxidizer gases before injecting the gases into chamber 213. In other embodiments, oxidizer gas and source gas may be mixed prior to injecting the gases into chamber 213 by providing apertures (not shown) between body plenum 241 and gas ring plenum 236. In one embodiment, third, fourth, and fifth gas sources, 234C, 234D, and 234D', and third and fourth gas flow controllers, 235C and 235D', provide gas to body plenum by way of gas delivery lines 238. Additional valves, such as 243B (other valves not shown), may shut off gas from the flow controllers to the chamber. In implementing certain embodiments of the invention, source 234A comprises a silane $SiH_4$ source, source 234B comprises a molecular nitrogen $N_2$ source, source 234C comprises a TSA source, source 234D comprises an argon Ar source, and source 234D' comprises a disilane $Si_2H_6$ source.

In embodiments where flammable, toxic, or corrosive gases are used, it may be desirable to eliminate gas remaining in the gas delivery lines after a deposition. This may be accomplished using a 3-way valve, such as valve 243B, to isolate chamber 213 from delivery line 238A and to vent delivery line 238A to vacuum foreline 244, for example. As shown in FIG. 2A, other similar valves, such as 243A and 243C, may be incorporated on other gas delivery lines. Such three-way valves may be placed as close to chamber 213 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 2A, chamber 213 also has top nozzle 245 and top vent 246. Top nozzle 245 and top vent 246 allow independent control of top and side flows of the gases, which improves film uniformity and allows fine adjustment of the film's deposition and doping parameters. Top vent 246 is an annular opening around top nozzle 345. In one embodiment, first gas source 234A supplies source gas nozzles 239 and top nozzle 245. Source nozzle MFC 235A' controls the amount of gas delivered to source gas nozzles 239 and top nozzle MFC 235A controls the amount of gas delivered to top gas nozzle 245. Similarly, two MFCs 235B and 235B' may be used to control the flow of oxygen to both top vent 246 and oxidizer gas nozzles 240 from a single source of oxygen, such as source 234B. In some embodiments, oxygen is not supplied to the chamber from any side nozzles. The gases supplied to top nozzle 245 and top vent 246 may be kept separate prior to flowing the gases into chamber 213, or the gases may be mixed in top plenum 248 before they flow into chamber 213. Separate sources of the same gas may be used to supply various portions of the chamber.

A remote plasma cleaning system 250 is provided to periodically clean deposition residues from chamber components. The cleaning system includes a remote plasma generator 251 that creates a plasma from a cleaning gas source 234E (e.g., molecular fluorine, nitrogen trifluoride, other fluorocarbons or equivalents) in reactor cavity 253. In embodiments, examples of remote plasma generators include microwave or radio frequency (RF) sources. Examples of such generators may include inductively coupled, transformer coupled, capacitively coupled, as well as other systems known in the art for generating high density plasma species. The reactive species resulting from this plasma are conveyed to chamber 213 through cleaning gas feed port 254 by way of applicator tube 255. The materials used to contain the cleaning plasma (e.g., cavity 253 and applicator tube 255) must be resistant to attack by the plasma. The distance between reactor cavity 253 and feed port 254 should be kept as short as practical, since the concentration of desirable plasma species may decline with distance from reactor cavity 253. Generating the cleaning plasma in a remote cavity allows the use of an efficient plasma generator and does not subject chamber components to the temperature, radiation, or bombardment of the glow discharge that may be present in a plasma formed in situ. Consequently, relatively sensitive components, such as electrostatic chuck 220, do not need to be covered with a dummy wafer or otherwise protected, as may be required with an in situ plasma cleaning process. In FIG. 2A, the plasma-cleaning system 250 is shown disposed above the chamber 213, although other positions may alternatively be used.

A baffle 261 may be provided proximate the top nozzle to direct flows of source gases supplied through the top nozzle into the chamber and to direct flows of remotely generated plasma. Source gases provided through top nozzle 245 are directed through a central passage 262 into the chamber, while remotely generated plasma species provided through the cleaning gas feed port 354 are directed to the sides of the chamber by the baffle 261.

Figure 3:
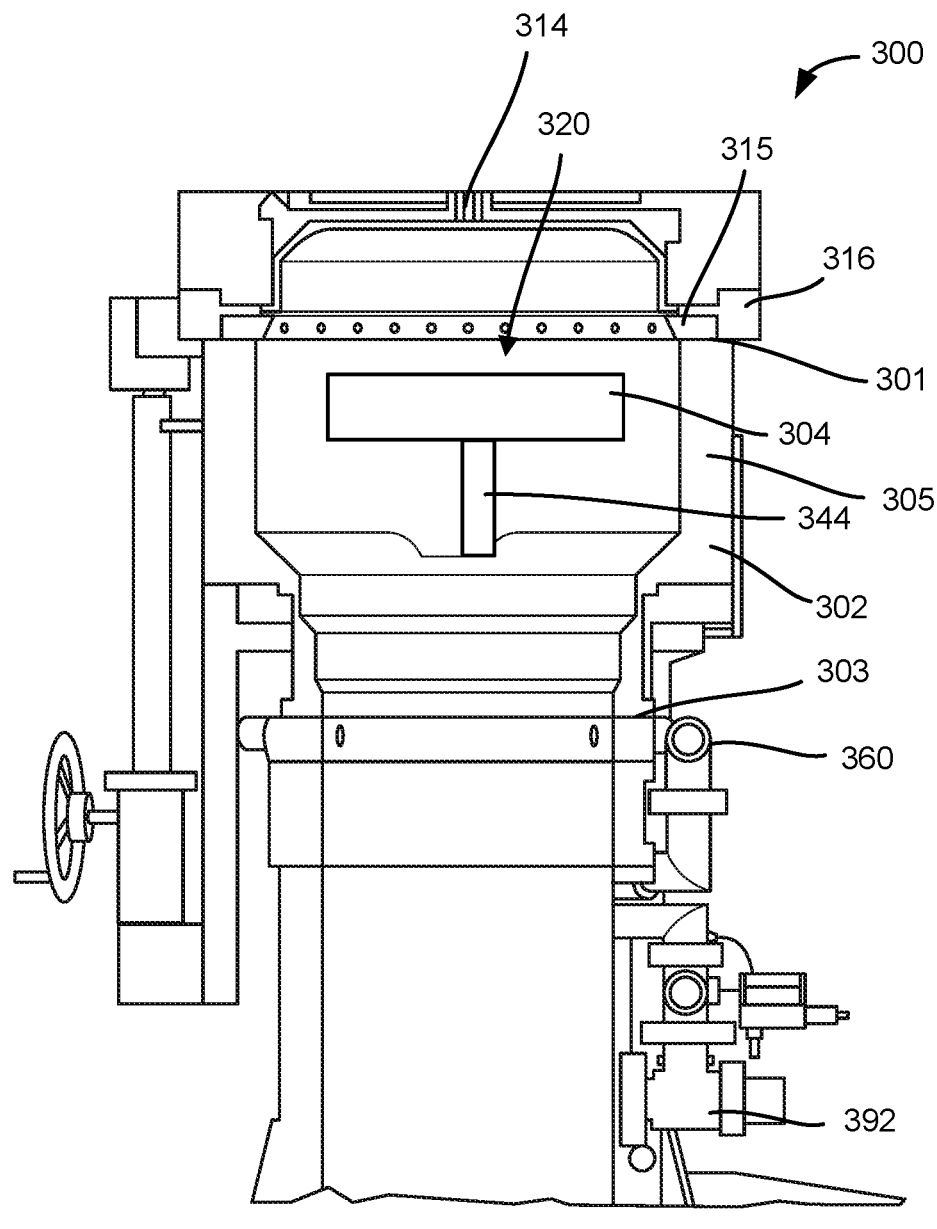
FIG. 3 shows a partial cross-sectional side view of a processing chamber according to embodiments of the present technology.

Turning next to FIG. 3, a cross-sectional view of an exemplary processing chamber 300 according to some embodiments of the present technology is illustrated. In embodiments, the chamber 300 may include any one or more of the features discussed above in regards to system 210. It is understood that, in embodiments, features ending in like reference numerals as features discussed above are similar, except as noted below. The processing chamber 300 includes a chamber body 302 having a top (or first) end 301 and a bottom (or second end) 303. A gas ring 315 and a lid 316 may be coupled to the top end 301 of the chamber body 302. The chamber body 302, gas ring 315, and substrate support 304 define a processing region 320 in which a substrate may be processed on the substrate support 304. The substrate support 304 may be disposed on a shaft 344 and movably positioned in the chamber body 302 through the shaft 344, or the substrate support 304 may be stationary and supported by chamber sidewalls, such as discussed in regards to system 210 above. In embodiments, port adapter system 360 may be coupled to the bottom end 303 of the chamber body 302, or may be formed on or around a bottom end 303 of the chamber body 302.

As noted above, in embodiments, it may be necessary to clean all undesirable contaminants remaining in the chamber body 302 from the prior deposition operation to prevent substrate defects in subsequent operations. A cleaning gas, which may be any etching or cleaning gas as known in the art, such as nitrogen trifluoride, in embodiments, may be introduced or flowed into the chamber body 302, such as into the processing region 320, from the top end 301 of the chamber body 302 to react with contaminants in the processing region 320 of the chamber body 302. For instance, a cleaning gas may be introduced through an inlet 314, which may be connected to a plasma cleaning system (not shown), as known in the art, and flowed through a gas ring 315, into processing region 320. In embodiments, the cleaning gas may be activated by microwave or radio-frequency (RF) power to dissociate the cleaning gas, such as $NF_3$, into reactive groups to interact with any contaminants present. Additionally or alternatively, a cleaning gas may be activated prior to introduction through inlet 314 (e.g. remotely), and may include an inert carrier gas, such as argon or helium.

Regardless of the form of the cleaning gas, once the cleaning gas is introduced into the chamber body, it may interact with deposits and other contaminants present in the chamber body 302 (including any sidewalls or bottom wall thereof), substrate support 304, shaft 344, lid 316, and/or gas ring 315, as well as any other exposed surfaces of one or more chamber components. During and/or after cleaning, the port adapter system 360 may be utilized to remove the cleaning gas from the chamber body 302 by creating a flow path from the top end 301 of the chamber body 302 to the bottom end 303 that distributes the cleaning gas around the chamber body 302 and any chamber components therein. In embodiments, the distribution may exhibit improved uniformity over convention systems, and may therefore contact all or a portion of the exposed surfaces for an approximately even amount of time. The port adapter system 360 can, therefore, facilitate a more efficient and complete cleaning of the chamber body 302 after one or more deposition processes.

As shown in FIG. 3, a port adapter system 360 may be coupled to the bottom end 303 of the chamber body 302 through welding, adhesive, releasable or non-releasable fastening, or the like. However, in other embodiments, the port adapter and the chamber body may be monolithically formed together such that the port adapter system may form the bottom end of the chamber body. In some such embodiments, the apertures may be formed in a bottom or lower portion of the respective sidewall or sidewall region. In yet other embodiments, the port adapter may be positioned in an intermediate position of the chamber body between the between the top and bottom ends of the chamber body.

Nonetheless, turning to FIG. 4A-4D, which illustrate various views of the port adapter system 360, the port adapter system 360 may include an adapter body 361, adapter shafts 365a-365c (shown more clearly in FIGS. 4B and 4C), and adapter flanges 367a-367c radially extending from the adapter body 361. The port adapter body 361 may be formed from stainless steel, aluminum, or the like. The adapter flanges 367a-367c may be coupled to valves 363a-363c, which may in turn be fluidly coupled to a system foreline 392 (e.g., an exhaust pump) through a piping system 380a-380c. The system foreline 392 may be fluidly coupled to an exhaust outlet and a system foreline to a vacuum source. In this manner, the system foreline 392 can remove gas from the chamber body 302 through the port adapter system 360 and piping system 380a-380c out to the vacuum source. While three flanges, valves, and shaft are shown, it should be understood that more or less of each port adapter component may be present, as will be discussed in greater detail below. Thus, in embodiments, the flange(s), valve(s), and/or shaft(s) may be present in an amount that corresponds to the number or port adaptor apertures 362a-362x.

The adapter body 361 may have a toroidal or annular shape. However, in other embodiments, the port adapter body may have any other geometric shape, such as being cuboid or the like, or may mirror a cross-sectional shape of the chamber body 302. An outer surface 366b of the adapter body 361 may define recesses 369 circumferentially spaced about the adapter body 361. The recesses 369 may be sized and shaped to receive one or more fasteners (as discussed further in regards to FIG. 4D below). However, as discussed above, it should be clear that such recesses 369 may not be present if the port adaptor is monolithically formed with the chamber body.

One or more adapter shafts 365a-365c may have a first end that is fixedly or releasably attached to adapter body 361, and may extend radially outward from the adapter body 361 to a second end. The adapter shafts 365a-365c may be cylindrical and therefore have a generally circular cross-section. However, in other embodiments, the adapter shafts may have any other geometric shape, and corresponding cross-sectional shape, such as being cuboid or the like. Nonetheless, in embodiments, the adapter shafts 365a-365c may be attached to the adapter body 361 at a location on adapter body 361 such that each shaft 365a-365c surrounds an external surface of one or more apertures 362a-362c, defining a fluid flow path from an interior of the port adapter 361, through the one or more apertures 362a-362c, into the respective adapter shaft 365a-365c.

One or more adapter flanges 367a-367c may be provided at a second end of the respective adapter shaft 365a-365c, such that the respective adapter shaft 365a-365c spaces each flange 367a-367c radially apart from the processing region 320 and/or adapter body 361. In embodiments, one or more of the adapter flanges 367a-367c may include an outer diameter (or cross sectional width) larger than an outer diameter (or cross sectional width) of the adapter shafts 365a-365c. However, in other embodiments, there may be no adapter flanges, or the adapter flange may be a second section of the one or more adapter shafts 365a-365c which may have an outer diameter that is similar to, the same as, or different from the outer diameter of the one or more adapter shafts 365a-365c.

Nonetheless, as discussed above, the adapter body 361 may define one or more apertures 362a, 362b (as well as aperture 362c, as shown more clearly in FIGS. 4B and 4C) extending through the adapter body 361. In embodiments, each aperture 362a-362c may extend from an inner surface 366a to an outer surface 366b of the adapter body 361 and fluidly connect the processing region with a respective adapter shaft 365a-365c and adapter flange 367a-367c. Thus, each aperture 362a-362c may be in fluid communication with the processing region 320 and a system foreline 392. Although the port adapter body 361 is depicted as defining three apertures 362a-362c, in embodiments, the port adapter body may define more or less port adapter apertures (e.g., one two, four, five, or the like). There may be as many adapter shafts 365a-365c and adapter flanges 367a-367c extending from the adapter body 361 as there are apertures 362a-362c. For example, in embodiments, there may be more or less than three apertures and, correspondingly, more or less than three adapter shafts. The adapter shafts 365a-365c and adapter flanges 367a-367c may be concentric with the apertures 362a-362c, as illustrated most clearly in FIG. 4D.

In embodiments, one or more of the apertures 362a-362c may have a generally cylindrical shape and corresponding volume (e.g. the volume defined by the aperture from the inner surface 366a to the outer surface 366b). However, in other embodiments, the apertures may have any other geometrical shape, including being ovoid, rectangular, frusto-conical, or the like, defining a volume therein. The inner surface 366a and outer surface 366b of each aperture 362a-362c may define an opening for the apertures 362a-362c and/or may define a cross-sectional shape corresponding to flange surfaces 364a-364c. However, in embodiments, the surfaces may define the apertures to have openings of any shape, including being circular, ovoid, rectangular, triangular, a slit-shape, or the like. In more embodiments, each apertures may have different shapes and sizes, and therefore be independently selected to be the same or different.

As discussed above, the present technology has surprisingly found that improved cleaning can be obtained by carefully spacing one or more apertures around the adapter body 361 alone or in combination with tailored features of the adapter system 360 that allow a high level of control over the flow conductance. For instance, in embodiments, controlling the flow rate of gas removed through a respective aperture 362a-362c and spacing of the apertures 362a-362c may allow the uniformity of a cleaning gas to be improved in flow path and exhaust rate, as the gas flows across the chamber body 302 and exposed surfaces therein. Controlling the gas exhaust rate and/or flow path may allow a desired volume of cleaning gas to flow over any portion of the chamber body 302, such as a portion disposed between respective apertures 362a-362c, as well as over other exposed surfaces therein. The spacing (and therefore, location, in embodiments) of the apertures 362a-362c may allow a defined gas flow path to be selected and flow along the desired sections of the chamber body 302 (e.g., along all sections of the chamber body 302). If one of the gas flow rate or spacing is incorrectly tuned, the flow path of the cleaning gas may not uniformly interact with all portions of the chamber body 302. For example, if the flow is not properly tuned, the portions of the chamber body 302 adjacent the aperture 362a-362c with a lower gas flow rate and/or greater spacing may not be fully cleaned by the cleaning gas Accordingly, the present technology allows tailored tuning of flow conductance by carefully controlling one or more flow rate factors, such as the flow rate of gas entering the apertures 362a-362c and/or the spacing between the apertures 362a-362c, as an example, to provide a gas flow suitable for the cleaning of the selected chamber body 302.

For example, in embodiments, a precise gas flow rate to one or more apertures, such as any one or more of apertures 362a-362c in an example, may be adjusted by decreasing a size of the respective aperture or by carefully selecting the spacing of the respective aperture. As discussed above, the spacing of the apertures 362a-362c may be important to controlling the uniformity of gas flow across the chamber body 302. In embodiments, the apertures 362a-362c (and thus, the corresponding adapter shafts 365a-365c and adapter flanges 367a-367c, in embodiments) may be spaced apart along adapter body 361, which may be shown most clearly in FIG. 4B.

For example, apertures 362a-362c may be spaced apart along the adapter body 361, which may be an arcuate path, in embodiments, such that each respective aperture defines an arc of greater than or about 80° between each respective aperture, such as greater than or about 85°, such as greater than or about 90°, such as greater than or about 95°, such as greater than or about 100°, such as greater than or about 105°, such as greater than or about 110°, such as greater than or about 115°, such as greater than or about 120°, such as greater than or about 125°, such as greater than or about 130°, such as greater than or about 135°, such as less than or about 150°, such as less than or about 145°, such as less than or about 140°, such as less than or about 135°, such as less than or about 130°, or any ranges or values therebetween. Nonetheless, in embodiments, the apertures 362 may be spaced apart such that a distance between each adjacent set of apertures varies by an arc length that less than or about 25° from an average arc length (e.g. the average of each arc length between adjacent apertures 362 present in the respective port adaptor 360), such as less than or about 20°, such as less than or about 15°, such a less than or about 10°, such as less than or about 5°, such as less than or about 2.5°, such as less than or about 1°, or any ranges or values therebetween.

Stated differently, as other adapter body 361 shapes may be utilized in embodiments, each aperture may be spaced apart from an adjacent aperture such that a distance between adjacent apertures is within about 30% of a total average distance, such as less than or about 20%, such as less than or about 17.5%, such as less than or about 15%, such as less than or about 12.5%, such as less than or about 10%, such as less than or about 7.5%, such as less than or about 5%, such as less than or about 2.5%, such as less than or about 1% from an average distance (e.g. the average of each distance between adjacent apertures 362 present in the respective port adaptor 360), or any ranges or values therebetween. Nonetheless, in embodiments, each aperture may be spaced apart generally equidistant around the circumference of the adaptor body. For instance, if three apertures are present, the apertures may be spaced apart approximately 120° along an arcuate path, or if four are present, the apertures may be spaced apart approximately 90°, as examples only.

Thus, in embodiments, by carefully spacing the apertures 362a-362c around the adaptor body according to any one or more of the above ranges, a cleaning gas may be removed through the port adapter system 360 such that a uniformity of a flow of the cleaning is improved across the interior of the chamber body 302. Namely, as discussed above, in conventional systems, ports or apertures have been spaced in order to maximize flow (such as a flow rate) from the chamber, to quickly clean and evacuate process gasses from the chamber to more quickly cycle between process operations. However, such port orientations in conventional systems were asymmetric (e.g., large variance in spacing between ports), attempting to utilize a combination of high and low conductance ports to overcome differences in flow rates while maintaining maximum removal speeds at consistent chamber pressure. However, such asymmetric systems failed to uniformly clean the chamber and chamber components and were insufficient to control the etch rate of cleaning gasses. Conversely, the present technology has surprisingly found that by carefully controlling the orientation and configuration of the port adaptor components, excellent flow rates and symmetric cleaning can be obtained.

For instance, in conjunction with orientation of apertures discussed above, the present technology has found that one or more factors controlling the flow conductance through a respective aperture 362a-362c and its corresponding fluid flow path to the foreline allow a tailored removal speed to be obtained for each aperture 362 and corresponding flow path. In embodiments, flow rate factors may include one or more of aperture diameter, flow path diameter, and total flow path distance (e.g. the flow path length between each respective aperture 362a-362c and the foreline). In some embodiments, one or more throttle valves may also be utilized, but may not be necessary, depending on the factors discussed above. When referring to "flow rate" herein, the system foreline 392 may remove cleaning gas from the interior region of the chamber body 302 through the apertures 362a-362c such that each of the flow paths originating at each apertures 362a-362c may have a flow rate of the gas removed through the respective aperture specific to each of the respective flow paths. In embodiments, the flow rate may be measured in the aperture volume defined between the inner and outer surfaces 366a, 366b, and system foreline 392.

Thus, in embodiments, one or more of the diameters and shapes of one or more individual apertures 362a-362c may be adjusted to control the flow rate of gas removed through the respective apertures 362a-362c flow path. For example, the diameter of the aperture 362a, as an example only, may be increased to increase the flow rate of gas exhausted through the aperture 362a and/or the diameter of one or more of the apertures 362b, 362c may be decreased to decrease the flow rate of gas removed through the apertures 362b, 362c. In another example, the shape of the apertures 362a-362c may alternatively or additionally be individually adjusted to adjust the flow rate of gas removed through the apertures 362a-362c.

In embodiments, the diameter of the apertures 362a-362c may be greater than or about 0.2 inches, such as greater than or about 0.4 inches, such as greater than 0.6 inches, such as greater than 0.8 inches such as greater than about 1 inch, or may be less than or about 4 inches, such as less than or about 3.5 inches, such as less than or about 3 inches, such as less than or about 2.5 inches, such as less than or about 2 inches, or any ranges or values therebetween. In embodiments, each diameter of apertures 362*a*-362*c* may be selected to be the same or different according to any one more of the above diameters. In addition, it should be clear that any aperture present may be selected individually or jointly according to any one or more of the above apertures or values discussed herein in regards to apertures 362*a*-362*c*.

The flow rate of cleaning gas removed through a respective aperture 362*a*-362*c* may also be controlled by adjusting a flow path distance (also referred to as flow path length between the respective aperture 362*a*-362*c* and the system foreline 392), such as by adjusting the piping system 380*a*-380*c*. The piping system 380*a*-380*c* may each include one or more pipe sections 381, 382 (i.e., straight pipe sections 381 and angled pipe sections 382). The angled pipe sections 382 may be bent, curved, or have any other non-linear geometric shape. The pipe sections 381, 382 may be separate pieces coupled to each other or may be different sections along a monolithic pipe. However, in some embodiments, it should be understood that the flow path length may be altered by any methods known in the art to increase or decrease the path length, and may therefore simply refer to a pipe section having a change in ultimate path length, regardless of the number of sections or non-linear portions. The apertures 362*a*-362*c* may fluidly coupled to the system foreline 392 by the corresponding piping system 380*a*-380*c*. Such pipe system 380*a*-380*c* may define a flow path from one or more valves 363*a*-363*c* to the system foreline 392. The lengths of the respective pipe system 380*a*-380*c*, as well as the length of the respective flange 367*a*-367*c* defines a corresponding flow path length from the respective aperture 362*a*-362*c* to the system foreline 392.

Namely, as noted above, the flow path length may also contribute to the flow rate of gas removed through the respective aperture 362*a*-362*c*. For example, if the flow path length from the aperture 362*a* to the system foreline 392 is greater than the flow path length from the apertures 362*b*, and/or 362*c* to the system foreline 392, the aperture 362*a* may have a decreased flow rate compared to the apertures 362*b*, 362*c*, even with all other factors being held constant. Accordingly, the flow path length between the apertures 362*a*-362*c* and the system foreline 392 may be adjusted to correspondingly tailor the flow rate to the system foreline 392. For example, the flow rate to the aperture 362*a* may be increased by shortening the total path length of piping system 380*a* between the aperture 362*a* and the system foreline 392. Alternatively or additionally, to improve the uniformity of the relative flow rate of cleaning gas removed via one or more respective apertures 362*b* and/or 362*c*, the total path length of one or more piping system 380*b* and/or 380*c* between one or more of the apertures 362*b* and/or 362*c* and the system foreline 392 may be increased. Doing so may contribute to a decrease in flow rate of gas removed through one or more of the apertures 362*b*, 362*c* relative to the aperture 362*a*.

Nonetheless, in embodiments, the internal shape and/or diameter of the respective pipe system 380*a*-380*c* may be adjusted to control the flow rate. For example, certain portions of the pipe system 380*a*-380*c* may include increased or decreased diameters to correspondingly increase or decrease the flow rate. Alternatively or additionally, certain portions of the pipe system 380*a*-380*c* may include an alternative internal shape, such as exhibiting a funnel shape, a step-wise orientation, or the like to control the flow rate.

As noted above, adjusting one or more of a size of the apertures 362*a*-362*c*, the total flow path length between the apertures 362*a*-362*c* and the system foreline 392, and/or the path length may be utilized to further tailor the flow rate of the cleaning gas as the gas is removed. In embodiments, a combination of these flow rate factors may be applied to the port adapter system 360 to control the flow rate of gas exhausted through one or more of the respective apertures 362*a*-362*c*. For example, decreasing a flow rate of gas removed through aperture 362*a* may involve decreasing a size of the aperture 362*a*, increasing a flow path length between the aperture 362*a* and the system foreline 392, restricting a diameter of the respective pipe system 380*a*, and/or incorporating one or more non-linear pipe sections, as an example only. In another example, increasing a flow rate of gas removed through the aperture 362*b* may involve increasing a size of the aperture 362*b*, decreasing a flow path length between the aperture 362*b* increasing a diameter of the respective pipe system 380*b*, and/or reducing/eliminating any non-linear pipe sections to allow more gas to flow entering the aperture 362*b*, as an example only.

For instance, in an illustrated embodiment, which may be an example only, aperture 362*a* may be determined to be a limiting flow path, and may be provided to exhibit a minimum required (or any desired) flow rate to remove the gas while maintaining proper pressure in chamber body 302. Thus, in such an example, the flow paths extending through apertures 362*b* and/or 362*c* may be adjusted to increase and/or decrease the respective flow rate to exhibit a flow rate that is less than or about 10% from a flow rate through aperture 362*a*, such as within about 9%, such as within about 8%, such as withing about 7%, such as within about 6%, such as within about 5%, such as within about 4%, such as within about 3%, such as within about 2%, such as within about 1%, of the flow rate through aperture 362*a*, or any ranges or values therebetween.

Nonetheless, in embodiments, each flow path through apertures 362*a*-362*c* may contain one or more independently controllable valves 363*a*-363*c*. For example, one or more of the valves 363*a*-363*c* may be an isolation valve (i.e., a valve that can turn the flow on or off for a particular aperture 362*a*-362*c*) or a throttle valve (i.e., a valve that can adjust between a range of flow rates). The valves 363*a*-363*c* may be coupled along any point of the adaptor system 360, such as any point between a respective aperture 362*a*-362*c* and the foreline 392, in embodiments. For instance, in embodiments the one or more valves 363*a*-363*c* may be secured to the adapter flanges 367*a*-367*c*, and/or to pipe system 380*a*-380*c*. The valves 363*a*-363*c* may be fluidly coupled to the system foreline 392 (e.g. within the respective flow path initiated by apertures 326*a*-362*c*) such that the valves 363*a*-363*c* may isolate the respective flow path, or control the flow rate of gas entering system foreline 392 from the apertures 362*a*-362*c*.

In embodiments, one or more of the valves 363*a*-363*c* may individually control if gas is allowed to enter the respective aperture, 362*a*-362*c*. In some embodiments, one or more of the valves 363*a*-363*c* may also independently control the gas flow rate through each of the corresponding apertures 362*a*-362*c* independent of the other valves 363*a*-363*c*. However, in embodiments, it may not be necessary for throttle valves to be present due to the other flow rate factors that may be tailored as discussed above.

While throttle valves may not be necessary due to the above discussed parameters, the present technology has surprisingly found that due at least in part to the spacing and flow conductance of the present technology, one or more individually controllable isolation valves may be utilized to selectively clean portions of the chamber body. For instance, by providing independently controllable valves 363*a*-363*c*, gas flow may be restricted and directed to one or more sections of the chamber body 302. For example, a portion of the chamber body 302 between the apertures 362a, 362b may be determined to have more undesirable contaminants (e.g., a portion of the chamber body 302 between the apertures 362a, 362b that has remaining contaminants after an initial clean). In such an example, the valve 363c may be closed, restricting the gas flow entering the aperture 362c (e.g., through partially or completely closing the valve 363c). Accordingly, the gas flow rate of gas entering apertures 362a, 362b may be higher than the gas flow rate of gas entering the aperture 362c, leading to more of the gas being directed toward the apertures 362a, 362b. This, in turn, leads to more gas to flow over the portion of the chamber body 302 adjacent (e.g. between) the apertures 362a, 362b. In this manner, more cleaning gas may be directed to specific sections of the chamber body 302 by individually adjusting the valves 363a-363c such that one or more of the valves 363a-363c has a different flow rate than the others. Thus, surprisingly, unlike conventional systems, the present technology may provide an initial clean with improved uniformity, as well as the ability to selectively clean regions within chamber body 302, such as the sidewalls. Nonetheless, in embodiments, an additional throttle valve 390 may be included.

Thus, in embodiments, the system according to the present technology may clean greater than or about 85 wt. % of residues deposited on chamber sidewalls, chamber pedestal, or a combination thereof, such as greater than or about 87.5 wt. %, such as greater than or about 90 wt. %, such as greater than or about 92.5 wt. %, such as greater than or about 95 wt. %, or any ranges or values therebetween. It is understood that in other embodiments, any number of valves may be adjusted to control for gas flow to target certain sections of the chamber body, such as two or more valves. In some embodiments, a computer system, as described further below, may be used to detect an amount of undesirable contaminants in the chamber body 302 (e.g., using one or more sensors) as well as to adjust the valves 363a-363c.

Nonetheless, while not necessary in embodiments, as discussed above, in embodiments, it may be beneficial for the valves 363b, 363c to be throttle valves such that each valve may be capable of restricting the rate of cleaning gas removed through the one or more apertures 362b, 362c (e.g., by closing the valves 363b, 363c). or instance, in an embodiment where the aperture 362a is further from the system foreline 392, it may be beneficial for the valve 363a to enable more cleaning gas to enter the aperture 362a (e.g., by being further opened) and/or the valves 363b, 363c may restrict the cleaning gas entering the apertures 362b, 362c (e.g., by being further closed relative to the valve 363a). In this manner, the cleaning gas entering the apertures 362a-362c from within the chamber body 302 may be further controlled. The valves 363a-363c may open or close to allow more gas to enter the apertures 362a-362c based on a flow path length (e.g., the valves 363a-363c may allow more gas to enter the apertures 362a-362c where the flow path length is longer or may restrict gas entering the apertures 362a-362c where the flow path length is shorter) and aperture 362a-362c size, as discussed further below.

Figure 4A:
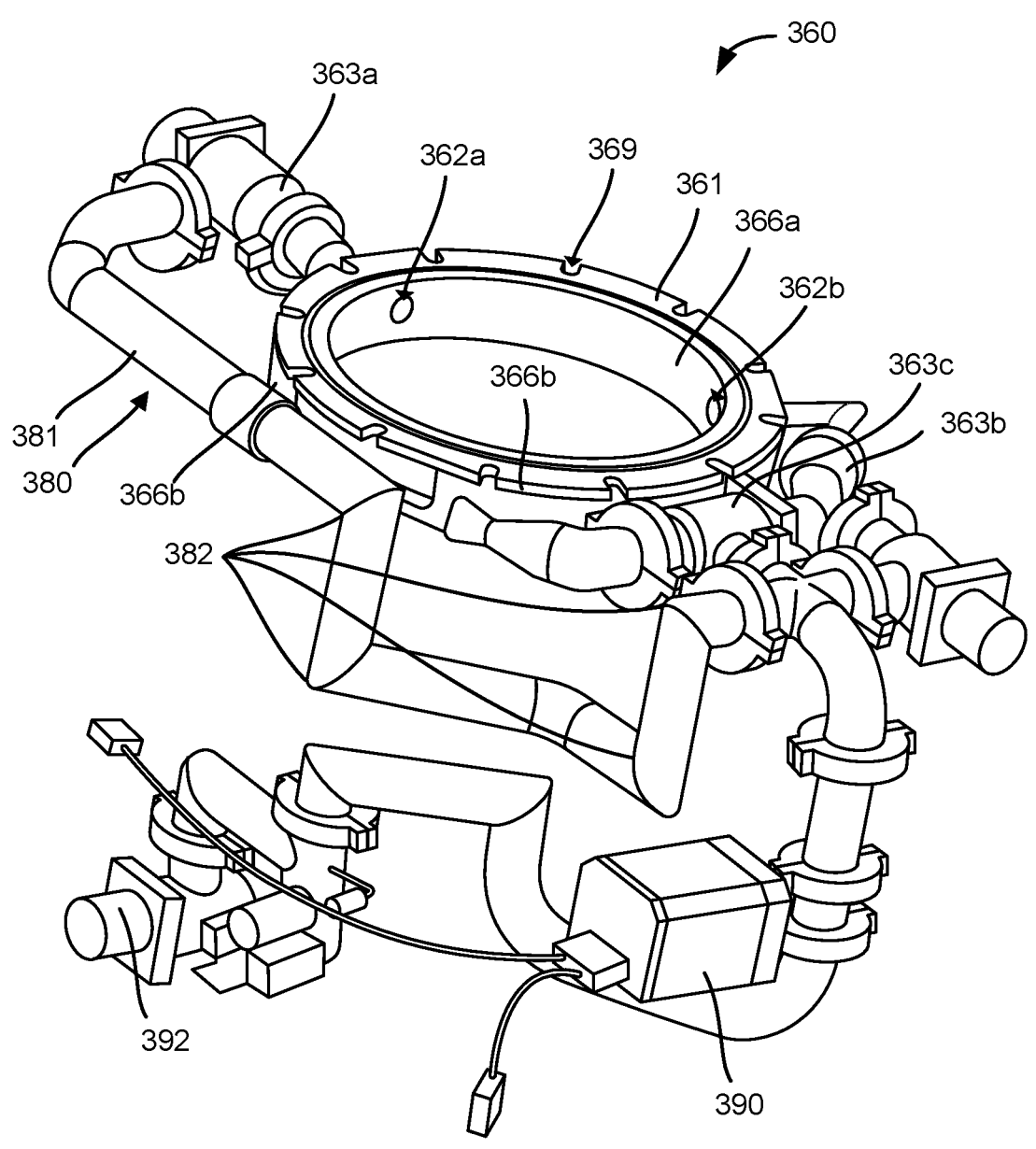
FIG. 4A shows an isometric view of a port adapter system according to embodiments of the present technology.
Figure 4B:
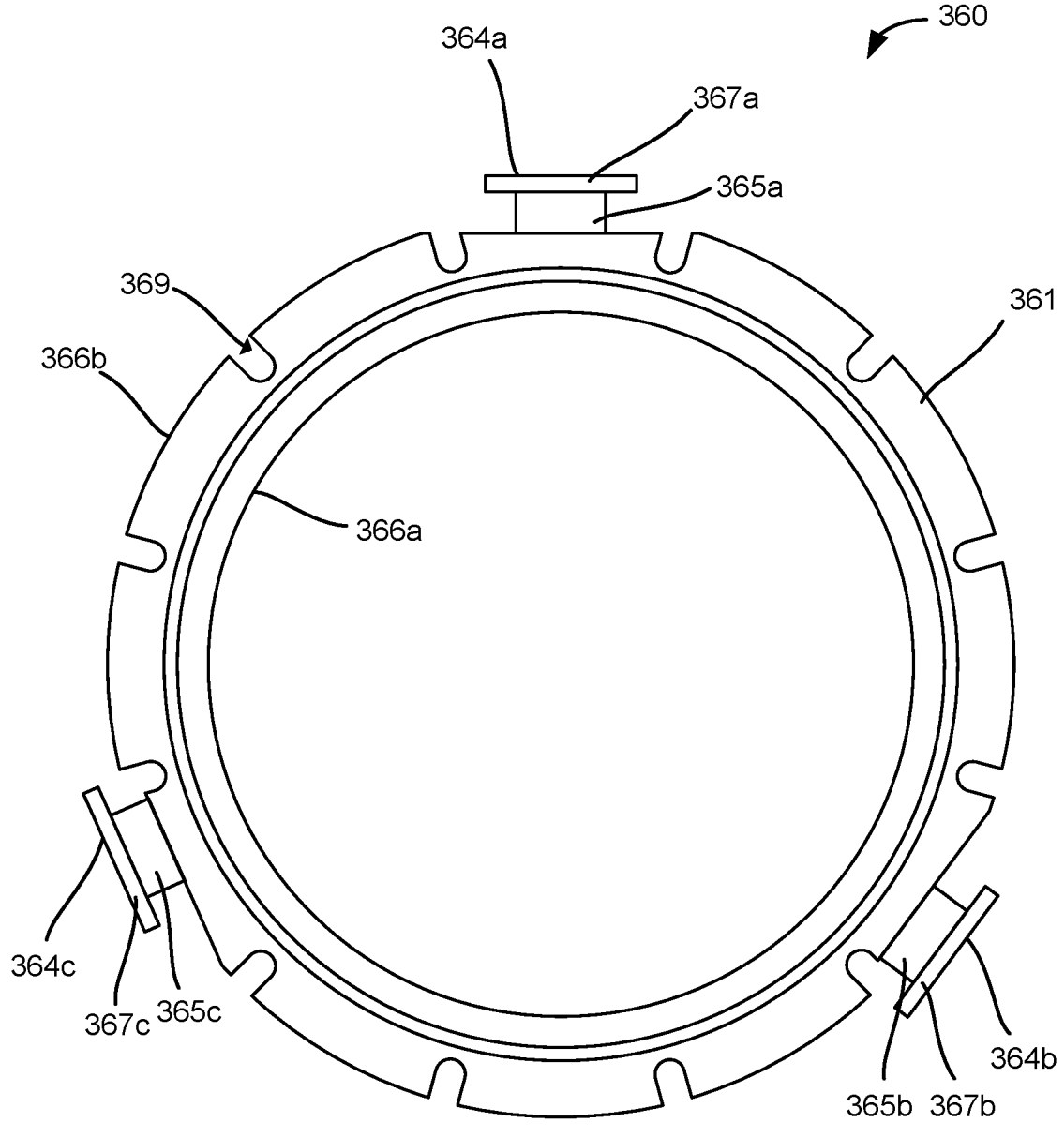
FIG. 4B shows a top-down view of a port adapter body of a port adapter system according to embodiments of the present technology.
Figure 4C:
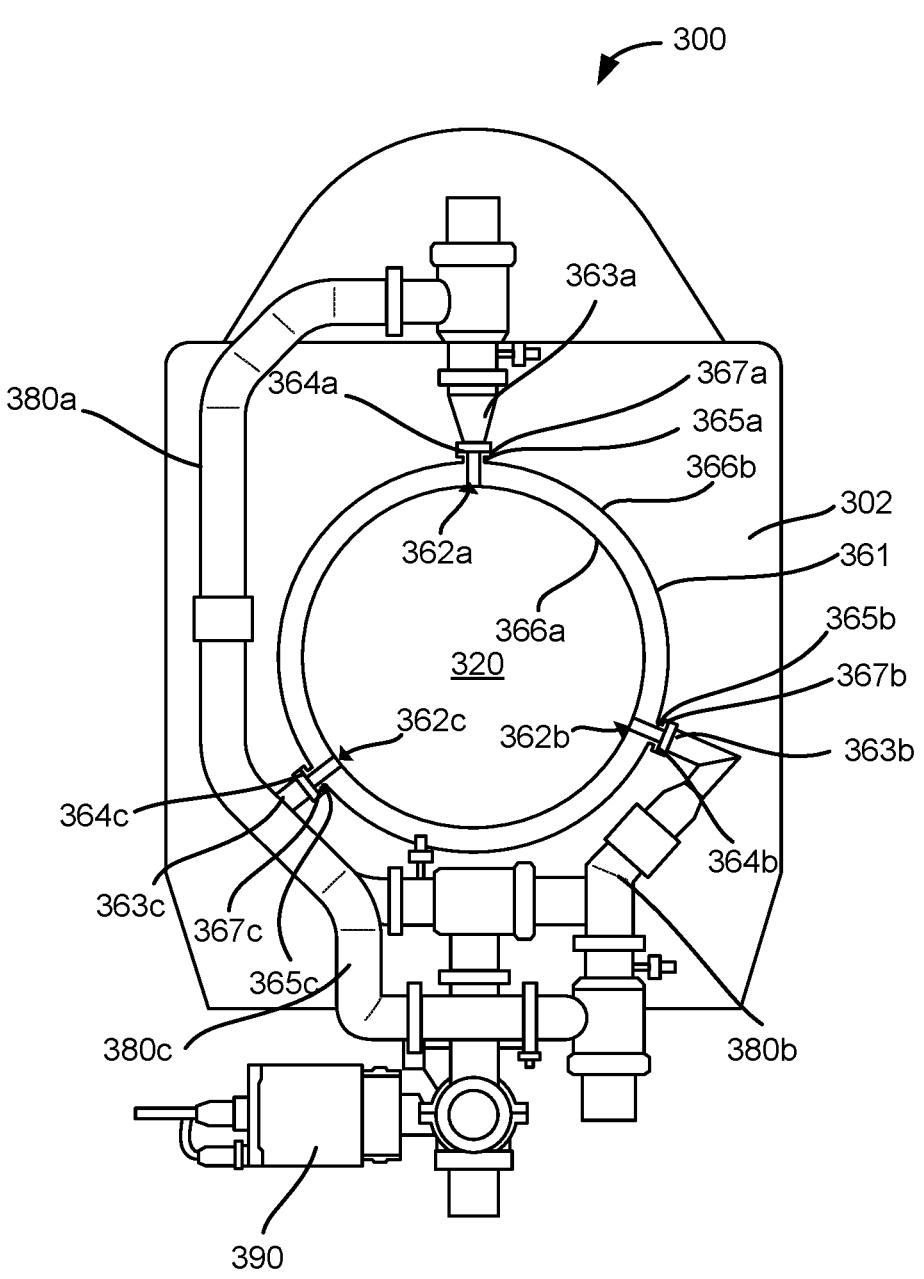
FIG. 4C shows a cross-sectional top-down view of a processing chamber according to embodiments of the present technology.
Figure 4D:
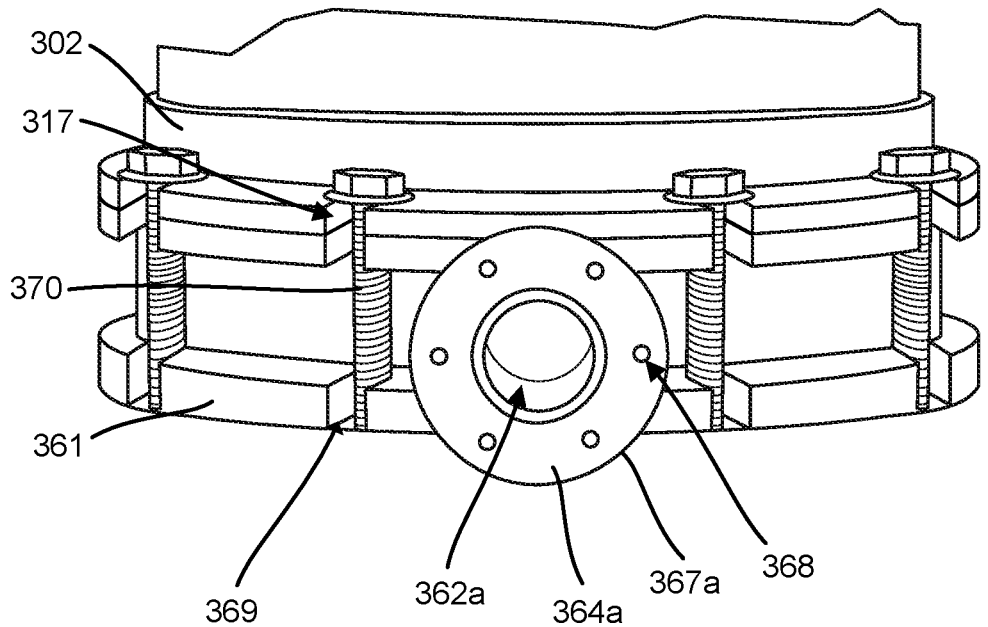
FIG. 4D depicts a partial side view of a processing chamber according to embodiments of the present technology.

Turning to FIG. 4D, the adapter flange 367a may define fastener apertures 368 circumferentially spaced from each other along the adapter flange 367a. The fastener apertures 368 may have a circular shape. However, in other embodiments, the fastener apertures may have any other shape, including being ovoid, rectangular, triangular, a slit-shape, or the like. Although not shown, the adapter flanges 367b, 367c may be structurally similar to the adapter flange 367a (e.g., including defining the same number of fastener apertures 368). However, in other embodiments, one or more of the adapter flanges may be different than the other flanges (e.g., have a different number of apertures, different shape, different size, or the like). The fastener apertures 368 may be configured to interface with a fastener (e.g., a screw, nail, bolt, rivet, or the like). For example, the port adapter system 360 may be coupled to one or more valves 363a-363c by positioning the valves 363a-363c to interface with the adapter flanges 367a-367c and then by inserting a fastener through apertures defined in the valves 363a-363c and through fastener apertures 368 along the adapter flanges 367a-367c. Although FIG. 4D depicts the adapter flange 367a defining six fastener apertures 368, in other embodiments, there may be any number of apertures (one, two, three, or the like). In other embodiments, the port adapter system may not include one or more of an adapter flange or shaft. For example, the port adapter system may not include adapter flanges and the valves may be coupled to the adapter shafts. In another example, the valves may be coupled directly to the adapter body. For instance, in embodiments, the port adaptor system 360 and/or flanges 367a-367c may be welded or otherwise fixedly attached to processing system 100.

Further, the chamber body 302 may define recesses 317 that correspond with the recesses 369. In this example, a fastener system 370 (e.g., a bolt and washer) may be received within the recesses 317, 369 to couple the port adapter system 360 to the bottom end of the chamber body 302.

Figure 5:
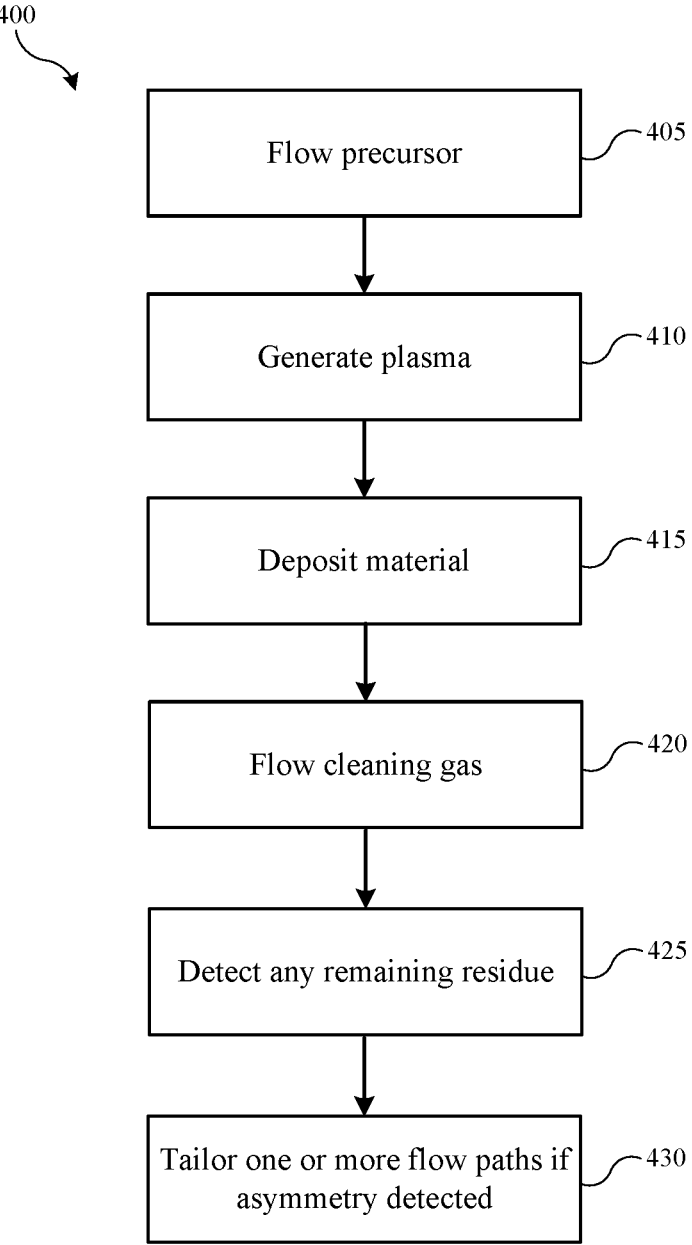
FIG. 5 shows operations of an exemplary method of semiconductor processing according to some embodiments of the present technology.

FIG. 5 shows operations of an exemplary method 400 of semiconductor processing according to some embodiments of the present technology. The method may be performed in a variety of processing chambers, including processing chamber 300 described above, which may include a port adapter system and other features according to embodiments of the present technology. Method 400 may include a number of optional operations, which may or may not be specifically associated with some embodiments of methods according to the present technology. The method 400 may be performed by a computer system, as described below.

Method 400 may include a processing method that may include operations for forming a hardmask film or other deposition operations (e.g., including forming thick or thin films). The method may include optional operations prior to initiation of method 400, or the method may include additional operations. For example, method 400 may include operations performed in different orders than illustrated. In some embodiments, method 400 may include flowing one or more plasma species or precursors thereof into a processing chamber at operation 405. For example, the precursor or remotely generated plasma, which may be a high-density plasma, in embodiments, may be flowed into a processing region of a chamber body, such as the chamber body 302 included in processing chamber 300. In some embodiments the precursor may be or include a carbon-containing precursor or plasma species.

At operation 410, a plasma may be provided to the processing region, such as by providing a remote plasma source, or other plasma source, as discussed above. Material formed in the plasma, such as a carbon-containing material, may be deposited on the substrate at operation 415.

At operation 420, once the deposition process has completed, a cleaning gas may be flowed into the chamber body 302 (e.g., from the gas ring 315) and removed through the processing region 320 and the port adapter system 360 positioned beneath the bottom end 303 of the chamber body 302. The system foreline 392 may remove the cleaning gas through the apertures 362a-362c of the adapter body 361, through the valves 363a-363c, through the pipe system 380, and toward a vacuum source.

Nonetheless, in embodiments, a detection operation 425 may be conducted to determine if any asymmetries in cleaning are present. Such detection may be by user observation, or via one or more sensors within the system. In some embodiments, a controller, which may include a computer system, a machine learning algorithm, artificial intelligence, or a combination thereof, may receive data from one or more sensors coupled to the chamber body 302 regarding the amount or presence of undesirable contaminants within the chamber body 302 and/or the flow of cleaning gas flowing through the chamber body 302, or wafer processing data obtained from one or more processed wafers. The controller may determine that there is an insufficient amount of cleaning within one or more sections of the chamber body 302 and thus remaining undesirable contaminants. In such an embodiment, the controller, or individual operator, at operation 430 may adjust the port adapter system 360 to alter the flow rate of gas entering the apertures 362a-362c. Specifically, the controller may control one or more of the valves 363a-363c to restrict or open to decrease or increase the flow rate of cleaning gas entering the apertures 362a-362c.

For example, the controller may determine that a section of the chamber body 302 adjacent apertures 362a and 362b may require additional cleaning gas. The controller may close the valve 363c to open to allow more gas to enter apertures 362a and 362b, thereby increasing the flow rate of gas entering the aperture 362a and 362b, and the flow therebetween. Alternatively or additionally, the controller may adjust one or more of the other valves 363b, 363c to restrict the flow therein, thus decreasing the flow rate of gas entering the apertures 362b, 362c relative to the aperture 362a.

However, in embodiments, operations 425 and/or 430 may be conducted by a user. Such observation may be visual or based upon one or more sensors. Nonetheless, in embodiments, a flow path may be restricted or opened based upon a detection of asymmetric cleaning or remaining residues.

Figure 6:
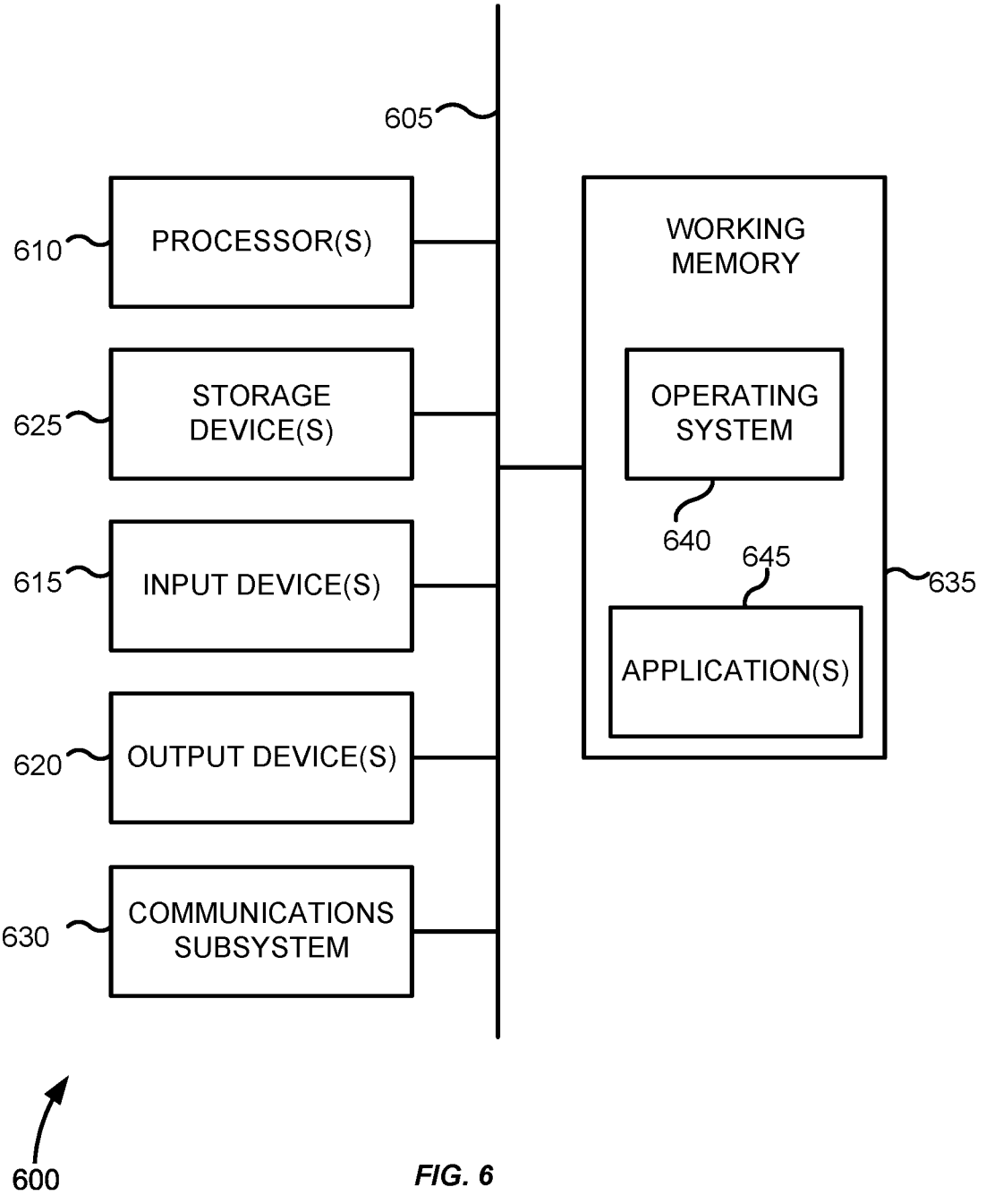
FIG. 6 shows a block diagram of an example computer system usable with systems and methods according to embodiments of the present disclosure.

Nonetheless, as illustrated in FIG. 6, in embodiments, the systems and methods may be executed fully or in part by a processor which may be incorporated as part of the previously described controller or processor. For example, system 600 can represent some of the components of a controller described herein. FIG. 6 provides a schematic illustration of one embodiment of a system 600 that can perform the methods provided by various other embodiments, as described herein. FIG. 6 is meant only to provide a generalized illustration of various components, any or all of which may be utilized as appropriate. FIG. 6, therefore, broadly illustrates how individual system elements may be implemented in a relatively separated or relatively more integrated manner.

The system 600 is shown including hardware elements that can be electrically coupled via a bus 605 (or may otherwise be in communication, as appropriate), which may also be connected with a controller discussed above. The hardware elements may include a processing unit 610, including without limitation one or more processors, such as one or more central processing units (CPUs), graphical processing units (GPUs), special-purpose processors (such as digital signal processing chips, graphics acceleration processors, and/or the like); one or more input devices 615, which can include without limitation a keyboard, a touchscreen, receiver, a motion sensor, a camera, a smartcard reader, a contactless media reader, and/or the like; and one or more output devices 620, which can include without limitation a display device, a speaker, a printer, a writing module, and/or the like.

The system 600 may further include (and/or be in communication with) one or more non-transitory storage devices 625, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The system 600 might also include a communication interface 630, which can include without limitation a modem, a network card (wireless or wired), an infrared communication device, a wireless communication device and/or chipset (such as a Bluetooth device, a 502.11 device, a Wi-Fi device, a WiMAX device, an NFC device, cellular communication facilities, etc.), and/or similar communication interfaces. The communication interface 630 may permit data to be exchanged with a network (such as the network described below, to name one example), other processors, and/or any other devices described herein. In many embodiments, the system 600 will further comprise a non-transitory working memory 635, which can include a RAM or ROM device, as described above.

The system 600 also can also include software elements, shown as being currently located within the working memory 635, including an operating system 640, device drivers, executable libraries, and/or other code, such as one or more application programs 645, which may include processor programs provided by various embodiments, and/or may be designed to implement methods, and/or configure systems, provided by other embodiments, as described herein. Merely by way of example, one or more procedures described with respect to the method(s) or systems discussed above might be implemented as code and/or instructions executable by a computer (and/or a processor within a computer); in an aspect, then, such special/specific purpose code and/or instructions can be used to configure and/or adapt a computing device to a special purpose computer that is configured to perform one or more operations in accordance with the described methods.

A set of these instructions and/or code might be stored on a computer-readable storage medium, such as the storage device(s) 625 described above. In some cases, the storage medium might be incorporated within a computer system, such as system 600. In other embodiments, the storage medium might be separate from a computer system (e.g., a removable medium, such as a compact disc), and/or provided in an installation package, such that the storage medium can be used to program, configure and/or adapt a special purpose computer with the instructions/code stored thereon. These instructions might take the form of executable code, which is executable by the system 600 and/or might take the form of source and/or installable code, which, upon compilation and/or installation on the system 600 (e.g., using any of a variety of available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Moreover, hardware and/or software components that provide certain functionality can comprise a dedicated system (having specialized components) or may be part of a more generic system. For example, a risk management engine configured to provide some or all of the features described herein relating to the risk profiling and/or distribution can comprise hardware and/or software that is specialized (e.g., an application-specific integrated circuit (ASIC), a software method, etc.) or generic (e.g., processing unit 610, applications 645, etc.) Further, connection to other computing devices such as network input/output devices may be employed.

Some embodiments may employ a controller, which may include a computer system, artificial intelligence, machine learning, combinations thereof, and the like (such as the system 600) to perform methods in accordance with the disclosure. For example, some or all of the procedures of the described methods may be performed by the system 600 in response to processing unit 610 executing one or more sequences of one or more instructions (which might be incorporated into the operating system 640 and/or other code, such as an application program 645) contained in the working memory 635. Such instructions may be read into the working memory 635 from another computer-readable medium, such as one or more of the storage device(s) 625. Merely by way of example, execution of the sequences of instructions contained in the working memory 635 might cause the processing unit 610 to perform one or more procedures of the methods described herein.

The terms "machine-readable medium" and "computer-readable medium," as used herein, refer to any medium that participates in providing data that causes a machine to operate in a specific fashion. In an embodiment implemented using the system 600, various computer-readable media might be involved in providing instructions/code to processing unit 610 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 625. Volatile media include, without limitation, dynamic memory, such as the working memory 635. Transmission media include, without limitation, coaxial cables, copper wire, and fiber optics, including the wires that comprise the bus 605, as well as the various components of the communication interface 630 (and/or the media by which the communication interface 630 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a magnetic medium, optical medium, or any other physical medium with patterns of holes, a RAM, a PROM, EPROM, a FLASH-EPROM, any other memory chip or cartridge, a carrier wave as described hereinafter, or any other medium from which a computer can read instructions and/or code.

The communication interface 630 (and/or components thereof) generally will receive the signals, and the bus 605 then might carry the signals (and/or the data, instructions, etc. carried by the signals) to the working memory 635, from which the processor(s) 610 retrieves and executes the instructions. The instructions received by the working memory 635 may optionally be stored on a non-transitory storage device 625 either before or after execution by the processing unit 610 and controller.

In the embodiments described above, for the purposes of illustration, processes may have been described in a particular order. It should be appreciated that in alternate embodiments, the methods may be performed in a different order than that described. It should also be appreciated that the methods and/or system components described above may be performed by hardware and/or software components (including integrated circuits, processing units, and the like), or may be embodied in sequences of machine-readable, or computer-readable, instructions, which may be used to cause a machine, such as a general-purpose or special-purpose processor or logic circuits programmed with the instructions to perform the methods. These machine-readable instructions may be stored on one or more machine-readable mediums, such as CD-ROMs or other type of optical disks, floppy disks, ROMs, RAMs, EPROMs, EEPROMs, magnetic or optical cards, flash memory, or other types of machine-readable mediums suitable for storing electronic instructions. Alternatively, the methods may be performed by a combination of hardware and software.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A processing chamber, comprising:
a chamber body including a first end and an opposed second end;
a lid coupled to the first end of the chamber body;
a gas ring adjacent the first end of the chamber body;
a substrate support, wherein a processing region is defined between the substrate support and the lid;
a port adapter system coupled to the second end of the chamber body, wherein the port adapter system comprises:
a port adapter body defining a plurality of apertures in fluid communication with the processing region, wherein each of the plurality of apertures are spaced apart along the port adapter body, such that a distance between adjacent apertures is within about 30% of an average aperture spacing distance;
an individually controllable valve fluidly coupled to one or more of the plurality of apertures; and
an exhaust system in fluid communication with a system foreline and the plurality of apertures;
wherein each aperture of the plurality of apertures is fluidly coupled to the exhaust system along a corresponding flow path,
a first aperture of the plurality of apertures has a first flow path to the exhaust system with a first flow path length that is longer than a flow path length of the other apertures of the plurality of apertures, and
the first aperture defines a diameter that is larger than a diameter of the other apertures of the plurality of apertures.

2. The processing chamber of claim 1, wherein each aperture of the plurality of apertures is spaced apart along an arcuate path such that a distance between respective apertures is from about 100° to about 140°.

3. The processing chamber of claim 2, wherein each aperture of the plurality of apertures is spaced apart along an arcuate path such that the distance between respective apertures is from about 115° to about 125°.

4. The processing chamber of claim 1, wherein the port adapter system is permanently or releasably affixed to the second end of the chamber body, or is monolithically formed with the chamber body.

5. The processing chamber of claim 1, wherein a second aperture of the plurality of apertures defines a diameter that is different than a diameter of one or more other apertures of the plurality of apertures and a second flow path length.

6. The processing chamber of claim 5, wherein:
the second flow path length is shorter than the flow path length of the one or more other apertures of the plurality of apertures; and
the diameter of the second aperture is smaller than the diameter of the other apertures of the plurality of apertures.

7. The processing chamber of claim 5, further comprising a pipe system comprising one or more non-linear portions.

8. A method of processing a substrate, comprising:
introducing a gas into a first end of chamber body of a processing chamber;
evacuating the gas through a port adapter system coupled to a second end of the chamber body, wherein the port adapter system comprises:
a port adapter body defining a plurality of apertures in fluid communication with the processing chamber, wherein each of the plurality of apertures are spaced apart from each other along the port adapter body, such that a distance between adjacent apertures is within about 30% of an average aperture spacing distance;
a plurality of independently controllable valves fluidly coupled to the plurality of apertures; and
an exhaust system in fluid communication with a system foreline and the plurality of apertures;
wherein each aperture of the plurality of apertures is fluidly coupled to the exhaust system along a corresponding flow path;
a first aperture of the plurality of apertures has a first flow path to the exhaust system with a first flow path length that is longer than a flow path length of the other apertures of the plurality of apertures; and the first aperture defines a diameter that is larger than a diameter of the other apertures of the plurality of apertures; and closing a first valve of the plurality of valves while maintaining at least a second valve of the plurality of valves in an open configuration; and further removing the gas from the chamber body through the port adapter system.

9. The method of claim 8, further comprising detecting a remaining residue and/or an asymmetric flow path prior to closing the first valve.

10. The method of claim 9, wherein the port adapter system further comprises a plurality of pipe systems, each pipe system of the plurality of pipe systems fluidly connected to an aperture of the plurality of apertures, and further comprising correcting one or more of a pipe system path length and a pipe system diameter based upon the detection of an asymmetric flow path.

11. The method of claim 9, further comprising re-opening the first valve after removing the residue.

\* \* \* \* \*